United States Patent [19]

Cleary et al.

[11] Patent Number: 6,063,202
[45] Date of Patent: May 16, 2000

[54] APPARATUS FOR BACKSIDE AND EDGE EXCLUSION OF POLYMER FILM DURING CHEMICAL VAPOR DEPOSITION

[75] Inventors: Thomas J. Cleary, Milpitas; James C. Wing, Los Altos, both of Calif.

[73] Assignee: Novellus Systems, Inc., San Jose, Calif.

[21] Appl. No.: 08/938,206

[22] Filed: Sep. 26, 1997

[51] Int. Cl.⁷ .................................................... C23C 16/00
[52] U.S. Cl. .......................... 118/728; 118/500; 279/128; 361/234
[58] Field of Search .................................. 118/500, 728; 279/128; 361/234

[56] References Cited

U.S. PATENT DOCUMENTS

| | | |
|---|---|---|
| 4,184,188 | 1/1980 | Briglia . |
| 5,556,476 | 9/1996 | Lei et al. . |
| 5,620,525 | 4/1997 | van de Ven et al. . |
| 5,810,933 | 9/1998 | Mountsier et al. . |

*Primary Examiner*—Leo B. Tentoni
*Attorney, Agent, or Firm*—Skjerven, Morrill MacPherson, Franklin & Friel LLP

[57] ABSTRACT

A structure and method exclude polymer film deposition from the backside and edge of a wafer during CVD processing. An electrostatic chuck (ESC), with radial and circular channels and grooves on its surface, secures a wafer to be processed. An inert gas, preferably argon, flows outward from these channels and grooves along the backside of the wafer. A uniform flow of the gas from underneath the wafer into the process chamber prevents monomer molecules from depositing on the wafer backside. For edge exclusion, a showerhead is placed slightly above the outer diameter of the wafer to keep most of the monomer molecules within the process chamber and redirect the remaining monomer molecules across the surface of the wafer below the outer edge of the showerhead. As a result, monomer molecules are prevented from depositing on the wafer edge because the redirected and limited flow across the wafer surface flows upward in the process chamber to be pumped out and because a cloud of gas formed about the edge of the wafer from the gas exiting the backside of the wafer prevents any additional monomer molecules from depositing on the wafer edge.

27 Claims, 4 Drawing Sheets

APPARATUS FOR BACKSIDE AND EDGE EXCLUSION OF POLYMER FILM DURING CHEMICAL VAPOR DEPOSITION

FIELD OF THE INVENTION

This invention relates to VLSI semiconductor film processing and, in particular, to the prevention of polymer film deposition on the edge and backside of a semiconductor wafer during CVD processing.

BACKGROUND OF THE INVENTION

In VLSI semiconductor film processing, dielectric materials are used as insulating layers between various circuits and layers of circuits in integrated circuit devices and other related electronic devices. As technology advances, these devices become increasingly smaller and denser, which results in narrower spacing between adjacent circuit elements, such as conductors which carry rapidly switching transient signals. Consequently, films with lower dielectric constants are needed to avoid cross talk and capacitive coupling between conductors. These polymer-type films are used because they can effectively fill gaps between adjacent circuit elements.

A recent development in VLSI semiconductor film processing utilizes insulating polymer films with dielectric constants of approximately 2.5 and less. Such films are typically formed using CVD chamber systems comprising of a vaporization chamber, a pyrolysis chamber, and a deposition chamber. A dimer is first vaporized and then pyrolyzed, i.e., cleaved into a monomer vapor form. The monomer then enters the deposition chamber and condenses on the surface of a semiconductor wafer to form a linked polymer film on the wafer.

However, during the deposition process, the polymer film can also form undesirably on the edge and backside of the wafer. Problems arise because the polymer film does not adhere readily to the wafer edge. Thus, a tendency exists for the polymer film formed on the edge and backside of the wafer to chip and flake, thereby introducing contaminants into the deposition chamber during fabrication of the wafer. Wafer cassettes can also be contaminated during transfer of wafers from one processing step to another. The cassettes typically only contact the wafers at their edges, so that any polymer film on the edges may be scraped off during wafer transportation. Furthermore, because some applications require the wafer backside to be free from any film formation, both backside and edge exclusion are desired during film deposition.

Conventional techniques for excluding deposition on the backside of a wafer include etching the backside of the wafer after film deposition. This approach entails added expense and time to the fabrication process. Other techniques for excluding deposition on the edge of a wafer, such as those disclosed in U.S. Pat. No. 5,620,525 to van de Ven, et al. and U.S. Pat. No. 5,556,476 to Lei et al., inject an inert control gas along the wafer edge from underneath the wafer up into the deposition chamber during tungsten CVD to prevent edge deposition. However, these methods are not effective for use in the monomer deposition process. One reason is the differences between monomer deposition and tungsten deposition, i.e., the flow rate of the monomer and the pressure of the deposition chamber are both low, typically in the range of 2–7 sccm and on the order of 50 mTorr, respectively, and the molecular weight of the monomer molecules is very high, i.e. 176 a.m.u. Because the flow rate of process gas for tungsten deposition is high, i.e., 2–3 standard liters per minute, and the molecular weight of the process gas is low, a high flow rate, i.e., 300 sccm to 3 standard liters per minute, of inert gas across the wafer edge can effectively prevent the process gas from depositing on the wafer edge. However, when the process gas flow is low, i.e., for monomer deposition, a high flow rate of the inert gas into the deposition chamber can dilute the process gas, resulting in substandard film deposition. By decreasing the inert gas flow rate, the inert gas is not able to adequately prevent high molecular weight process gases from depositing on the wafer edge.

Accordingly, a process and structure are desired which excludes polymer film formation on the edge and backside of a wafer during the deposition process.

SUMMARY OF THE INVENTION

A method and structure are provided for excluding monomer deposition on the backside and edge of a wafer during CVD processing. An electrostatic chuck (ESC), slightly larger than the wafer, is used to secure the wafer in place during processing. Backside exclusion is attained through the uniform outward flow of an inert gas between the lower surface of the wafer and the upper surface of the ESC. Channels and grooves on the upper surface of the ESC direct the inert gas along the backside of the wafer and out towards the process chamber in a manner which results in a uniform flow of the inert gas near the outer diameter of the wafer, thereby preventing monomer molecules from depositing on the wafer backside. The flow rate of the inert gas must be on the order of the flow rate of the monomer gas, i.e., 2–7 sccm, to prevent dilution of the monomer gas, which may result in substandard polymer film formation. Due to the low flow rate of the inert gas and the high molecular weight of the monomer molecules, argon (Ar) is a preferred inert gas because of its high molecular weight and ready availability.

The size, shape, and number of grooves and channels of the ESC are designed in such a way as to maximize the amount of backside exclusion, subject to system limitations. By increasing the height of the outer ridge of the ESC above the lower surface of the wafer, edge exclusion is improved because the flow rate of the inert gas across the wafer edge is increased. However, due to other deposition technology constraints, manufacturing an ESC with a heightened outer ridge is not always feasible. Consequently, edge exclusion using an ESC with an outer ridge that is coplanar with the lower surface of the wafer can be attained by positioning a showerhead slightly above the outer diameter of the wafer.

The shape and placement of the showerhead redirects the flow of the monomer gas so that most the gas molecules deposit on the portion of the wafer within the inner diameter of the showerhead. A smaller amount of monomer gas molecules deposits on the portion of the wafer directly below the edge of the showerhead as the remaining gas is re-directed across this outer portion of the wafer and up into the process chamber. As a result, some of the monomer molecules are prevented from depositing on the wafer edge. Other redirected monomer molecules are prevented from depositing on the wafer edge by a cloud formed about the wafer edge from the inert gas flowing outward through the backside of the wafer. A thin circular groove between the outer ridge of the ESC and the outer diameter of the wafer allows the control gas to flow into the process chamber and form the cloud. The directional flow of the inert gas in this groove prevents film deposition of the wafer backside.

The present invention will be better understood in light of the following detailed description taken together with the accompanying drawings.

BRIEF DESCRIPTION OF THE DRAWINGS

Use of the same numbers in different figures indicates similar or like elements.

DESCRIPTION OF THE INVENTION

Figure 1:
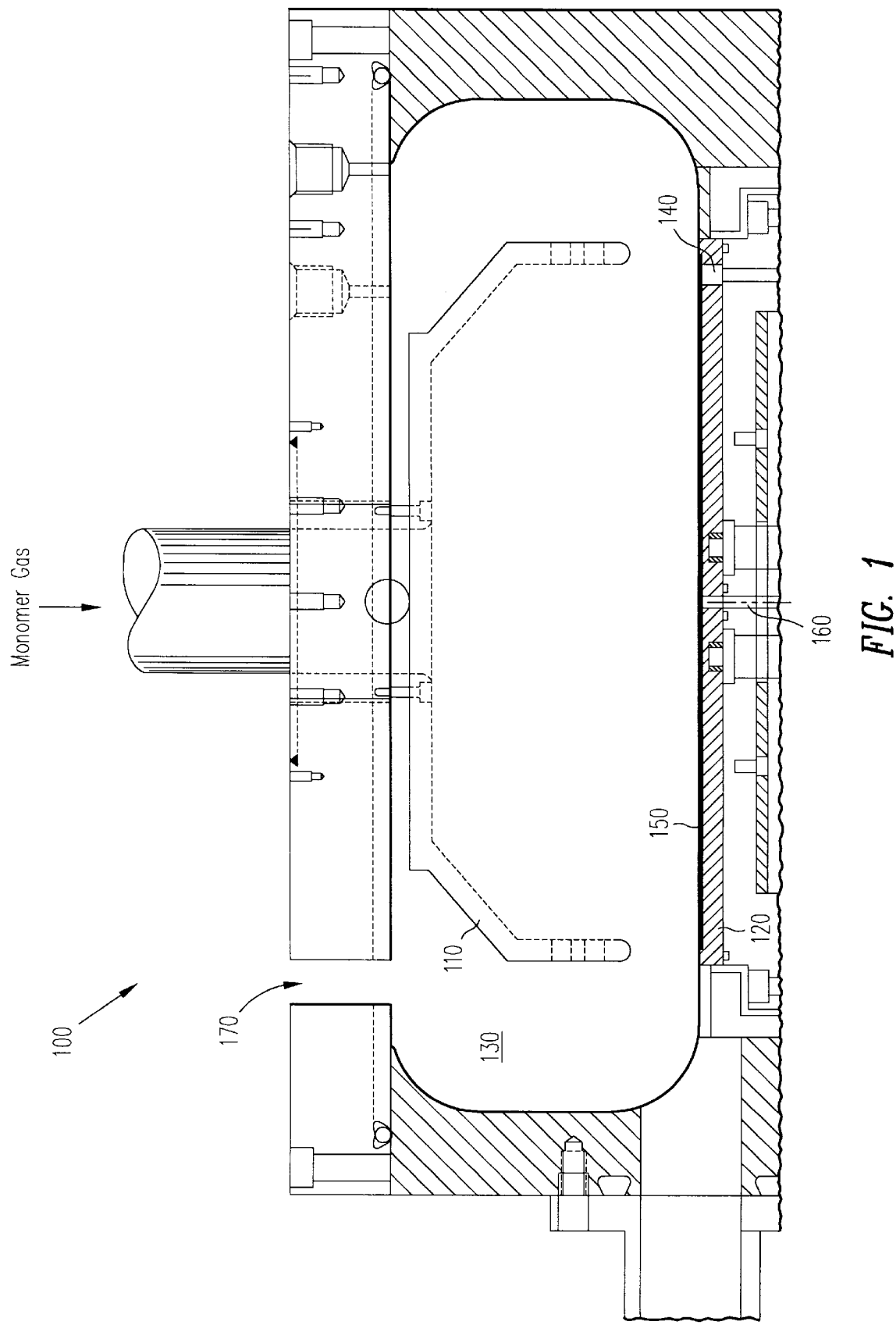
FIG. 1 illustrates a cross-sectional view of a monomer deposition chamber of the present invention.

A side view of a deposition chamber 100 for forming polymer films on a semiconductor wafer is shown in FIG. 1. Deposition chamber 100 includes a showerhead 110 and an electrostatic chuck (ESC) 120. A semiconductor wafer 150 to be processed is first inserted into a process chamber 130 by means of a robotic arm (not shown) or other suitable means. After being placed over ESC 120, three lift pins 140 (only one of which is shown) lower wafer 150 onto ESC 120. Wafer 150 is then secured to ESC 120 by electrostatic force, as described in U.S. Pat. No. 4,184,188 to Briglia, which is hereby incorporated by reference in its entirety. Other suitable means for securing wafer 150 to ESC 120 can also be used with the present invention. Monomer gas then enters process chamber 130 via showerhead 110 and deposits onto the surface of wafer 150, thereby forming a polymer film on the wafer surface.

The monomer molecules are prevented from depositing on the wafer edge and backside due in part to an inert gas, preferably Argon (Ar), being injected through a gas port 160 at the center of ESC 120. The inert gas is forced outward between the backside of wafer 120 and the upper surface of ESC 120 along channels and grooves on the upper surface of ESC 120. Monomer molecules are swept away from the edge and backside of wafer 150 by the flow of the inert gas into process chamber 130 and up towards pump-out ports 170 (only one shown), thus preventing a polymer film from forming on the wafer edge and backside. The inert gas and any remaining process gases are then pumped out of process chamber 130 via pump-out ports 170.

Figure 2A:
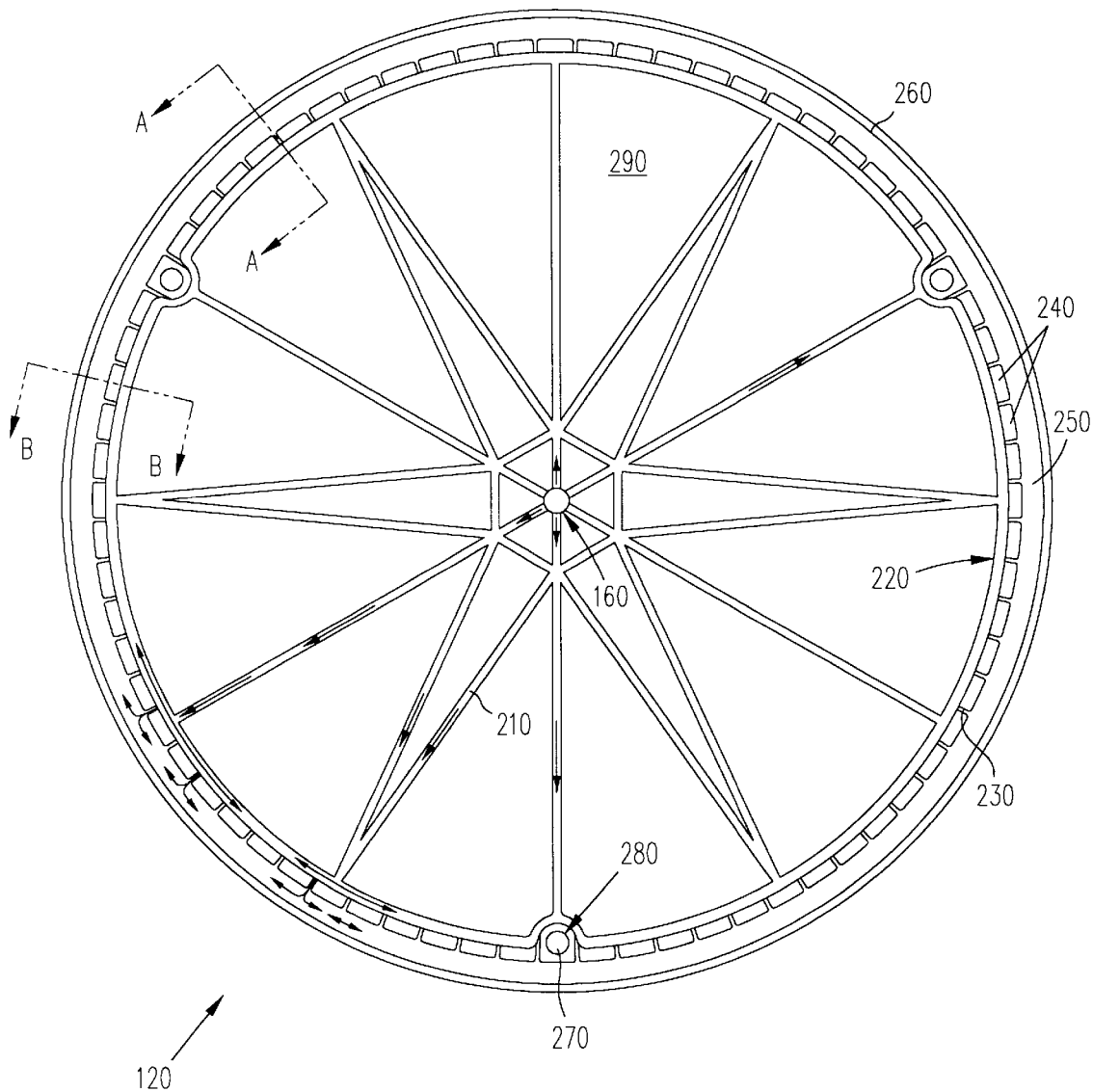
FIGS. 2A and 2B illustrate top views of different embodiments of an electrostatic chuck (ESC) of the present invention.

FIG. 2A illustrates a top view of ESC 120 according to one embodiment of the present invention. ESC 120 is preferably slightly larger than wafer 150, i.e. on the order of 6 mm larger in diameter. However, the diameter of ESC 120 can be in range of approximately 0 to 30 mm larger than the diameter of wafer 150. Wafer 150 can be a variety of sizes, such as 300 mm, 200 mm, or 150 mm. The inert gas is injected into ESC 120 through gas port 160. The inert gas then flows outward through radial gas supply channels 210, as indicated by the arrows in FIG. 2A, and into an inner circular channel 220. Generally, the cross-sectional area of gas port 160 is 50% to 500% the cross-sectional area of gas supply channels 210. Commonly owned U.S. Pat. Ser. No. 08/602,432, entitled "WAFER COOLING DEVICE", filed Feb. 16, 1996, now U.S. Pat. No. 5,810,933, issued on Sep. 22, 1998, describes an electrostatic chuck with gas supply channels 210 and inner circular channel 220 and is incorporated by reference herein in its entirety.

Figure 2B:
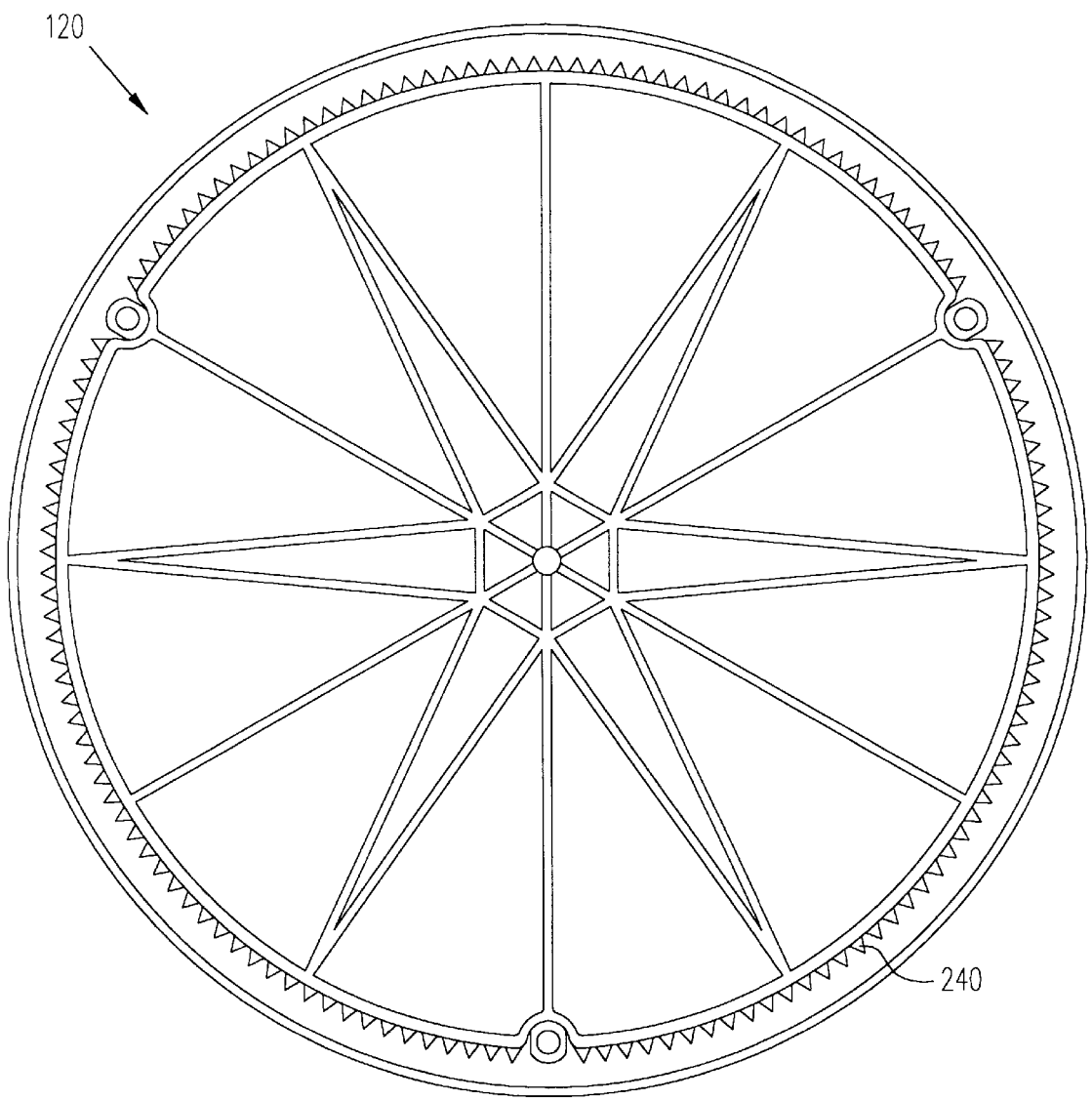

After leaving inner circular channel 220, the inert gas then passes through grooves 230 between wafer seals 240 and into an outer circular channel 250. Note that although wafer seals 240 are shown as rectangular-shaped, other shapes can also be used for the present invention. FIG. 2B shows another embodiment of the present invention having triangular-shaped wafer seals 240. Experimental results have shown that use of triangular-shaped wafer seals provides better backside exclusion than use of rectangular shaped seals because the gas exiting between triangular-shaped wafer seals is more uniform than gas exiting between rectangular-shaped wafer seals. A particular shape of wafer seals 240 is a design choice, depending in part on the deposition pressure for example.

Figure 3:
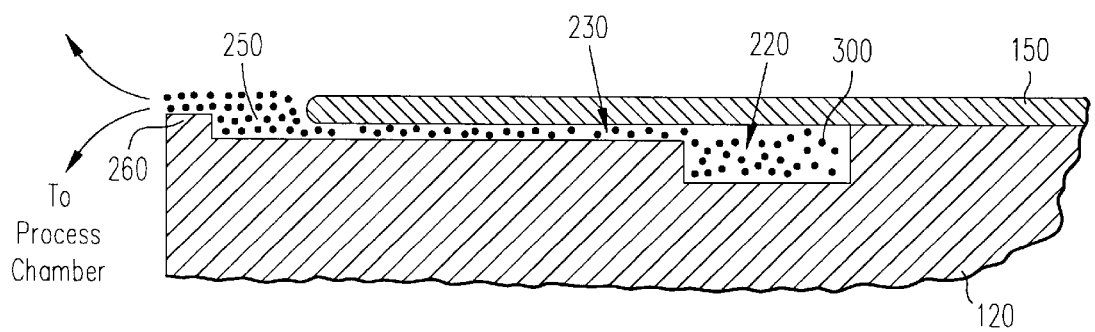
FIG. 3 illustrates a side view of an ESC and a wafer.
Figure 4:
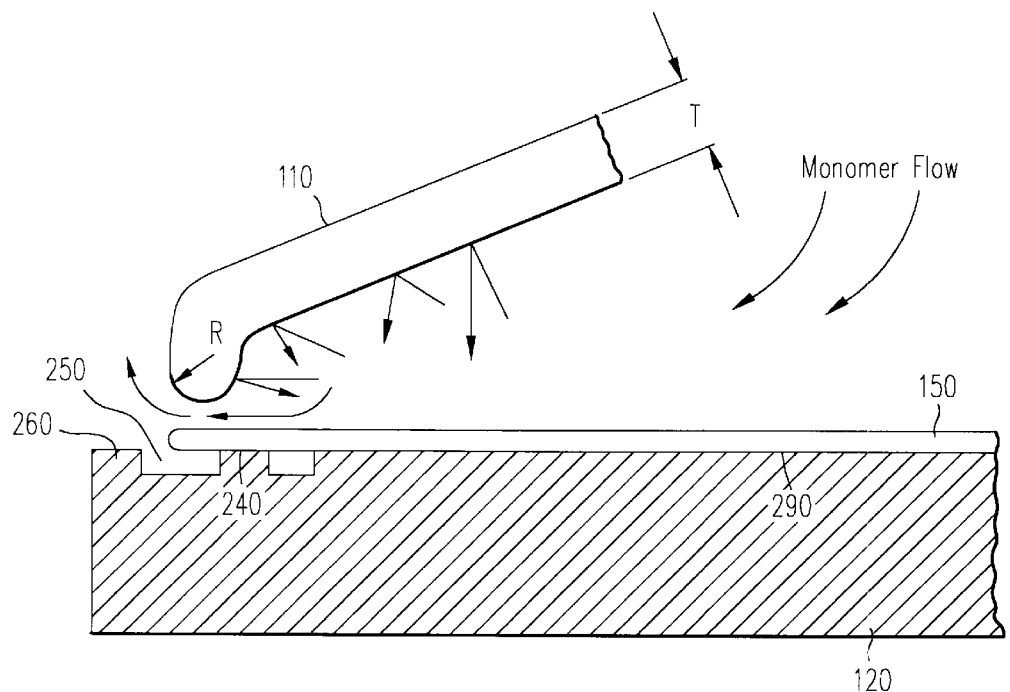
FIG. 4 illustrates a side view of an ESC, a wafer, and a portion of a showerhead of FIG. 1.

As shown in FIGS. 3 and 4, which are side views of ESC 120 of FIG. 2A along sectional lines A—A and B—B, respectively, the edge of wafer 150 extends beyond wafer seals 240 and hangs over a partial area of outer circular channel 250, such that the inert gas exits from underneath wafer 150 and into process chamber 130 via outer channel 250. Referring back to FIG. 2A, outer channel 250 is located between the outer diameter of wafer seals 240 and the inner diameter of an outer ridge 260. Also shown on ESC 120 are three holes 270 for lift pins 140. Lift pin seals 280 surround each hole 270 and electrostatically seal the holes to prevent contamination from process gases during deposition. It should be noted that with reference to FIGS. 2 and 4, wafer seals 240, lift pin seals 280, and the interior portion 290 of ESC 120 are substantially co-planar, i.e., within 30 $\mu$m, and polished, i.e., below 5 $\mu$m Ra, such that once wafer 150 is secured to ESC 120, neither inert gases nor process gases can enter regions between wafer 150 and wafer seals 240, lift pin seals 280, and interior portion 290, thereby effectively sealing these regions from contact with any gases.

In FIG. 3, inert gas 300 flows from inner circular channel 220, into grooves 230, and then through outer circular channel 250. The outward uniform flow of inert gas 300 thus prevents monomer molecules from depositing on the backside of wafer 150. In one embodiment, the width of inner circular channel 220 is between 0.5 and 2.5 mm, with a preferred width of 1.5 mm, and the depth of inner circular channel 220 is between 0.2 and 2.0 mm, with a preferred depth of 0.7 mm. Grooves 230 are typically between 0.5 to 5 mm wide and between 5 and 700 $\mu$m deep, preferably 5 to 50 $\mu$m deep. In one embodiment, the number of grooves 230 ranges from 20 to 360, depending partly on the size of the wafer. A current preferred number of 141 is utilized with a 200 mm wafer. However, the number of grooves 230 can be changed, depending on the amount of backside exclusion desired. Generally, backside exclusion increases as the number of grooves 230 increases because gas exiting grooves 230 becomes more uniform as the number of grooves increases. The more uniform the flow of the inert gas into outer circular channel 250, the more polymer film is excluded from the backside of the wafer in portions between grooves 230, i.e. in front of raised seals 240.

Inert gas 300 flows from grooves 230 into process chamber 130 via a circular gap defined between the outer diameter of wafer 150 and the inner diameter of ridge 260. The gap is 1.5 mm wide in one embodiment; however other widths may also be suitable. FIG. 3 shows the upper surface of ridge 260 slightly above the bottom surface of wafer 150. Inert gas 300 thus flows partially across the edge of wafer 150, as shown, to provide partial edge exclusion. The more ridge 260 rises above the bottom surface of wafer 150, the more inert gas 300 flows across the edge of wafer 150 to prevent monomer molecules from depositing on the wafer edge, resulting in increased edge exclusion. In addition, the width of the circular gap can be decreased for further edge exclusion.

However, current manufacturing techniques and cost constraints may limit the height of ridge 260. Due to the low depth of grooves 230 and the need for depth uniformity for all of the grooves, precision must be maintained in machining the grooves. With current cost and manufacturing constraints, the upper surface of ridge 260 needs to be co-planar with the upper surface of wafer seals 240 and with interior portion 290 of ESC 120, as shown in FIG. 4. With ridge 260 co-planar with wafer seals 240, inert gas 300 enters process chamber 130 without significantly flowing across the edge of wafer 150. Consequently, some monomer molecules are allowed to deposit and form a polymer film on the wafer edge.

FIG. 4 shows a portion of showerhead 110 positioned slightly above the outer diameter of wafer 150 according to the present invention. This configuration provides edge exclusion even when the upper surface of ridge 260 is co-planar with wafer seals 240. By placing showerhead 110 slightly above wafer 150 and having the inner surface of showerhead 110 within the outer diameter of wafer 150, monomer molecules are prevented from depositing on the wafer edge. As seen in FIG. 4, due to the shape and positioning of showerhead 110, most of the monomer molecules are kept within the volume underneath showerhead 110 and subsequently deposit on wafer 150. However, some monomer molecules are re-directed across a thin gap between the edge of showerhead 150 and the portion of wafer 150 directly below the edge of showerhead 150, i.e., the outermost portion of wafer 150. These molecules rise into the process chamber and are thus prevented from depositing on the wafer edge. Furthermore, the re-directed and limited flow of the monomer gas molecules across the top of wafer 150, combined with a "cloud" formed about the wafer edge from the flow of the inert gas, also prevents monomer molecules from depositing on the wafer edge.

In one embodiment, the thickness T of showerhead 110 is 0.25 inches with a lower edge having a full radius R of 0.125 inches, and the distance between the lower edge of showerhead 110 and the upper surface of wafer 150 is between 0.5 and approximately 5 mm, with a preferred separation of 1 mm. Other shapes of showerhead 110, as well as different separations and placements of showerhead 110 relative to wafer 150, can be used to provide varying edge exclusion characteristics. It should be noted that monomer deposition on the portion of wafer 150 directly below the edge of showerhead 110 is much less than the remaining interior portion of wafer 150 due to the redirected and limited flow of monomer gas, as discussed above. Consequently, the ranges of thickness and the lateral placement of showerhead 110 depend on acceptable tolerances for film formation. For example, if the film must be uniformly formed within 3 mm from the outer edge of the wafer, the thickness and/or the lateral placement of showerhead 110 must be such that no more than 3 mm of showerhead 110 overlies the outer diameter of wafer 150. The shape and placement of showerhead 110 also contribute to backside exclusion, but not nearly to the extent of edge exclusion.

The degree of backside and edge exclusion is also affected by the flow rate of the inert gas. In general, the higher the flow rate, the less monomer molecules deposit on the wafer. However, the flow rate is limited by the flow rate of the monomer or process gas. If the flow rate of the inert gas is higher than the flow rate of the process gas, the inert gas may dilute the process gas, resulting in substandard polymer film formation on the wafer. Generally, the inert gas flow rate is limited to approximately equal or less that of the process gas flow rate. Thus, with the process gas flow rate for monomer deposition typically in the range of 2 to 7 sccm, the inert gas flow rate is also necessarily low. With such low flow rates, a heavy inert gas is needed in order to prevent the heavy monomer molecules from depositing on the wafer. Therefore, even though most inert gases can be used, argon (Ar) is preferred because of its relative high atomic weight and ready availability in semiconductor facilities, as compared with other inert gases. However, other inert gases such as helium, neon, nitrogen, argon, krypton, and xenon may also be suitable. With the gas pressure at gas supply channels 210 and inner circular channel 220 approximately 10 Torr, a flow rate of approximately 5 sccm of Ar has been found to provide backside exclusion of monomer molecules, where the pressure in process chamber 130 is approximately 50 mTorr.

The embodiments described above are illustrative only and not limiting. For example, even though an ESC has been described, any wafer clamp which secures the wafer by other means, such as mechanical or vacuum pressure, can be utilized. Furthermore, non-inert gases may be suitable for use in other applications according to the principles of this invention. Numerous alternative embodiments in accordance with the broad principles of this invention will be apparent to those skilled in the art.

We claim:

1. An apparatus for backside and edge exclusion of polymer film on a wafer during CVD, comprising:

a wafer clamp, wherein said wafer clamp comprises:

a peripheral raised region;

a plurality of raised seals, wherein the outer edges of said plurality of raised seals and the inner edge of said peripheral raised region form a first channel therebetween, and wherein adjacent raised seals form grooves therebetween; and a raised central region co-planar with said plurality of raised seals, wherein said the outer edge of said central region and the inner edges of said plurality of raised seals form a second channel therebetween;

wherein a gas flowing outward from said second channel to said grooves to said first channel along the edge and backside of said wafer prevents monomer molecules from depositing on the edge and backside of said wafer.

2. The apparatus of claim 1, wherein said raised central region and said plurality of raised seals are polished and secured to said wafer to prevent monomer molecules from depositing therebetween.

3. The apparatus of claim 1, wherein said central region comprises a gas inlet and radial channels for supplying said gas to said first and second channels and to said grooves.

4. The apparatus of claim 3, wherein the cross-sectional area of said gas inlet is 50% to 500% the cross-sectional area of said radial channels.

5. The apparatus of claim 1, wherein said plurality of raised seals includes a lesser plurality of raised lift pin seals surrounding holes for lift pins to raise and lower said wafer.

6. The apparatus of claim 1, wherein said raised seals are rectangular in shape.

7. The apparatus of claim 1, wherein said raised seals are triangular in shape.

8. The apparatus of claim 1 further comprising a gas flowing outward from said second channel to said grooves to said first channel along the edge and backside of said wafer, said gas being an inert gas.

9. The apparatus of claim 8, wherein said gas is selected from the group consisting of Helium, Neon, Nitrogen, Argon, Krypton, and Xenon.

10. The apparatus of claim 8, wherein said gas is Argon.

11. The apparatus of claim 1, wherein said raised peripheral region and said raised seals are substantially co-planar.

12. The apparatus of claim 1, wherein said grooves are approximately 0.5 to 5 mm wide and approximately 5 to 700 µm deep.

13. The apparatus of claim 12, wherein said grooves are approximately 5 to 50 µm deep.

14. The apparatus of claim 1, wherein said wafer clamp is approximately 0 to 30 mm larger in diameter than said wafer.

15. The apparatus of claim 14, wherein said wafer clamp is approximately 6 mm larger in diameter than said wafer.

16. The apparatus of claim 1, wherein the number of said grooves is from 20 to 360.

17. The apparatus of claim 16, wherein the number of said grooves is 141.

18. The apparatus of claim 8, wherein the flow rate of said gas is in the range of 2 to 7 sccm.

19. The apparatus of claim 1, wherein said wafer clamp is an electrostatic chuck.

20. The apparatus of claim 1, wherein said wafer is secured to said wafer clamp by clamping means.

21. The apparatus of claim 1, further comprising a showerhead positioned above the outer diameter of said wafer to redirect process gases across the surface of said wafer.

22. The apparatus of claim 21, wherein said showerhead is positioned between 0.5 and approximately 5 mm above the upper surface of said wafer.

23. The apparatus of claim 21, wherein the outer edge of said showerhead is positioned approximately above the outer edge of said wafer.

24. The apparatus of claim 21, wherein the thickness of said showerhead is approximately 0.25 inches or less.

25. The apparatus of claim 21, wherein said showerhead is rounded at its lower edge.

26. The apparatus of claim 24, wherein the inner edge of said showerhead is located no more than approximately 6 mm from the outer edge of said wafer.

27. The apparatus of claim 26, wherein the inner edge of said showerhead is located no more than 3 mm from the outer edge of said wafer.

* * * * *